(12) United States Patent
Li et al.

(10) Patent No.: US 10,243,589 B2
(45) Date of Patent: *Mar. 26, 2019

(54) MULTI-BIT ERROR CORRECTION METHOD AND APPARATUS BASED ON A BCH CODE AND MEMORY SYSTEM

(71) Applicant: INTERNATIONAL BUSINESS MACHINES CORPORATION, Armonk, NY (US)

(72) Inventors: Yufei Li, Shanghai (CN); Yong Lu, Shanghai (CN); Yi Wang, Shanghai (CN); Hao Yang, Shanghai (CN)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 114 days.

This patent is subject to a terminal disclaimer.

(21) Appl. No.: 15/240,648

(22) Filed: Aug. 18, 2016

(65) Prior Publication Data
US 2016/0359503 A1 Dec. 8, 2016

Related U.S. Application Data (60) Continuation of application No. 14/685,019, filed on Apr. 13, 2015, now Pat. No. 9,450,615, which is a
(Continued)

(30) Foreign Application Priority Data

Feb. 23, 2009 (CN) .......................... 2009 1 0007392

(51) Int. Cl.
H03M 13/15 (2006.01)
H03M 13/17 (2006.01)
(Continued)

(52) U.S. Cl.
CPC ......... H03M 13/1575 (2013.01); G06F 11/10 (2013.01); H03M 13/152 (2013.01);
(Continued)

(58) Field of Classification Search
CPC .................. H03M 13/1575; H03M 13/152
See application file for complete search history.

(56) References Cited

U.S. PATENT DOCUMENTS 3,568,148 A * 3/1971 Clark, Jr. ............... H03M 13/43
714/785
4,107,650 A * 8/1978 Luke ................... G11B 20/1833
714/762
(Continued)

FOREIGN PATENT DOCUMENTS

EP    1612949 A1    4/2006

OTHER PUBLICATIONS

Massey, "Error-Correcting Codes," IEEE Transactions on Information Theory, May 1973 (2 pages).
(Continued)

*Primary Examiner* — Joseph D Torres
(74) *Attorney, Agent, or Firm* — Griffiths & Seaton PLLC (57) ABSTRACT

Exemplary embodiments for providing multi-bit error correction based on a BCH code are provided. In one such embodiment, the following operations are repeatedly performed, including shifting each bit of the BCH code rightward by 1 bit while filling the bit vacated due to the rightward shifting in the BCH code with 0, calculating syndrome values corresponding to the shifting of the BCH code, and determining a first error number in the BCH code under the shifting based on the syndrome values corresponding to the shifting of the BCH code. In the case where the first error number is not equal to 0, modified syndrome values are calculated corresponding to the shifting of the
(Continued)

BCH code. The modified syndrome values are those corresponding to the case that the current rightmost bit of the BCH code under the shifting is changed to the inverse value. Additional operations are performed as described herein.

10 Claims, 4 Drawing Sheets

Related U.S. Application Data continuation of application No. 13/588,700, filed on Aug. 17, 2012, now Pat. No. 9,037,953, which is a division of application No. 12/704,231, filed on Feb. 11, 2010, now Pat. No. 8,402,352.

(51) Int. Cl.
*H03M 13/37* (2006.01)
*G06F 11/10* (2006.01)
*G11C 29/04* (2006.01)

(52) U.S. Cl.
CPC ... *H03M 13/1525* (2013.01); *H03M 13/1565* (2013.01); *H03M 13/17* (2013.01); *H03M 13/3746* (2013.01); *G11C 2029/0411* (2013.01)

(56) References Cited

U.S. PATENT DOCUMENTS

| | | | | |
|---|---|---|---|---|
| 4,201,976 | A * | 5/1980 | Patel | G11B 20/1833 714/765 |
| 4,541,091 | A * | 9/1985 | Nishida | G11B 20/1809 714/704 |
| 4,754,457 | A * | 6/1988 | Bright | H04L 7/042 375/368 |
| 5,068,858 | A * | 11/1991 | Blaum | G11B 20/1833 714/769 |
| 5,157,671 | A | 10/1992 | Karplus | |
| 5,379,305 | A * | 1/1995 | Weng | H03M 13/35 714/761 |
| 5,654,746 | A * | 8/1997 | McMullan, Jr. | A63F 13/12 348/E7.056 |
| 5,936,978 | A * | 8/1999 | Ramesh | H03M 13/175 714/762 |
| 6,427,219 | B1 * | 7/2002 | Yang | H03M 13/03 714/758 |
| 6,516,443 | B1 * | 2/2003 | Zook | G11B 20/10009 714/792 |
| 6,735,737 | B2 | 5/2004 | Sankaran et al. | |
| 7,103,825 | B2 | 9/2006 | Yedidia et al. | |
| 7,162,679 | B2 | 1/2007 | Liberol et al. | |
| 7,254,771 | B1 | 8/2007 | Song et al. | |
| 7,721,185 | B1 * | 5/2010 | Feng | H03M 13/1515 714/784 |
| 7,788,570 | B1 * | 8/2010 | Feng | H03M 13/1515 714/784 |
| 8,261,165 | B2 * | 9/2012 | Mutchnik | H03M 13/152 714/758 |
| 2009/0187808 | A1 * | 7/2009 | Nichols | H03M 13/175 714/762 |

OTHER PUBLICATIONS

Massey, "Step-by-step Decoding of the Bose-Chaudhuri-Hocquenghem Codes," IEEE Transactions on Information Theory, vol. IT-11, No. 4, Oct. 1965 (6 pages).

Chen et al., "Area efficient parallel decoder architecture for long BCH codes," V-73 to V-76, Department of Electrical and Computer Engineering, University of MN, ICASSP 2004, Minneapolis, MN 55455 USA (4 pages).

Cho et al., "Strength-Reduced Parallel Chien Search Architecture for Strong BCH Codes," IEEE Transactions on Circuits and Systems—II: Express Briefs, vol. 55, No. 5, May 2008 (5 pages).

Zhang et al., "High-speed architectures for parallel long BCH encoders," IEEE Transactions on Very Large Scale Integration (VLSI) Systems, vol. 13, No. 7, Jul. 2005 (6 pages).

Fei et al., "Multi-error Correcting Architecture Base on Long BCH Code," Patent Disclosure Review CN8-2008-0266, Aug. 2008 (11 pages).

Wong et al., "Enabling MLC NAND Flash for Cost-Effective, High-Capacity Data Storage," Apr. 15, 2010 (9 pages).

Tanzawa et al, "A Compact On-Chip ECC for Low Cost Flash Memories," IEEE Journal of Solid-State Circuits, vol. 32, No. 5, May 1997 (8 pages).

Okano et al., "A Construction Method of High-Speed Decoders Using ROM's for Bose-Chaudhuri-Hocquenghem and Reed-Solomon Codes," IEEE Transactions on Computers, vol. C-36, No. 10, Oct. 1987 (7 pages).

Liu et al., "Architecture for VLSI Design of Reed-Solomon Decoders," IEEE Transactions on Computers, vol. C-33, No. 2, Feb. 1984 (12 pages).

Wei et al., "A High-Speed Real-Time Binary BCH Decoder," IEEE Transactions on Circuits and Systems for Video Technology, vol. 3, No. 2, Apr. 1993 (10 pages).

2004 Beijing P.R.C., Publishing House of Electronics Industry: The Theory of Information and Coding: Second Edition (1 page).

2005 China Machine Press: Information Theory, Coding and Cryptography (1 page).

* cited by examiner

|                      | Error Probablility |            |
|----------------------|--------------------|------------|
| EDC/ECC Capability   | BLC                | MLC        |
| 0 bit error/page     | $10^{-7}$          | $10^{-5}$  |
| 1 bit error/page     | $10^{-14}$         | $10^{-10}$ |
| 2 bit error/page     | $10^{-20}$         | $10^{-14}$ |
| 3 bit error/page     | NA                 | $10^{-19}$ |
| 4 bit error/page     | NA                 | $10^{-24}$ |

FIG. 5

MULTI-BIT ERROR CORRECTION METHOD AND APPARATUS BASED ON A BCH CODE AND MEMORY SYSTEM

CLAIM TO PRIORITY

This Application is a Continuation of U.S. patent application Ser. No. 14/685,019, filed Apr. 13, 2015, which is a Continuation of U.S. patent application Ser. No. 13/588,700, filed Aug. 17, 2012, now U.S. Pat. No. 9,037,953, which is a Divisional of U.S. patent application Ser. No. 12/704,231, filed Feb. 11, 2010, now U.S. Pat. No. 8,402,352, which claims priority to Chinese Patent Application No. 200910007392.3 filed Feb. 23, 2009, entitled "Multi-Bit Error Correction Method And Apparatus Based on a BCH Code and Memory System."

BACKGROUND OF THE INVENTION

Field of the Invention

The present invention relates to the field of information technology, and more specifically, to a multi-bit error correction method and apparatus based on a BCH code and a memory system.

Description of the Related Art

With the advent and improvements to semiconductor technology, the ability to manufacture several hundred million transistors on a single chip has been realized. With each improvement, such transistors are increasingly miniaturized, as additional transistors are placed in the same space. This miniaturization, however, poses challenges to the reliability of such devices and systems.

SUMMARY OF THE INVENTION

The present invention provides a multi-bit error correction method and apparatus based on a BCH code and a memory system, so as to implement multi-bit error correction based on relatively long BCH codes.

According to one aspect of the present invention, there is provided a multi-bit error correction apparatus based on a BCH code, comprising: a syndrome value generation module for shifting each bit of the BCH code on which error correction is to be performed rightward by 1 bit while filling the bit vacated due to the rightward shifting in the BCH code with 0, and calculating syndrome values corresponding to the shifting of the BCH code; a modified syndrome value generation module for, corresponding to each rightward one bit shifting of the BCH code on which error correction is to be performed, calculating modified syndrome values corresponding to the shifting of the BCH code, wherein the modified syndrome values are those corresponding to the case that the current rightmost bit of the BCH code under the shifting is changed to the inverse value; an error number determination module for, corresponding to each rightward one bit shifting of the BCH code on which error correction is to be performed, determining a first error number in the BCH code under the shifting based on the syndrome values calculated by the syndrome value generation module.

According to the present invention, in the error correction process of the BCH code, bits that contain errors are determined by shifting the BCH code and, at the same time, determining whether the number of errors decreases; therefore, even for relatively long BCH codes, error correction may be easily performed, thereby implementing multi-bit error correction based on relatively long BCH codes while increasing the code density, decreasing redundancies, and improving the efficiency of error correction. Multi-bit error correction based on relatively short BCH codes may also be implemented.

BRIEF DESCRIPTION OF THE DRAWINGS

It is believed that the features, advantages, and objectives of the present invention will be better understood from the following detailed description of the embodiments of the present invention, taken in conjunction with the drawings, in which.

DETAILED DESCRIPTION OF THE DRAWINGS

In the design of semiconductor memory systems, redundancy bits are widely introduced to ensure a high level of reliability. Generally, in memory systems, redundancy bits are added by encoding data in a certain manner when the data are stored. On the other hand, when the data are read, the data are decoded in a corresponding manner, and in the decoding process, the redundancy bits are utilized to perform error correction.

Traditionally, single-bit error correction has always been the main technology in memory systems. In such a technology, error correction processing can only correct one bit of the processed data at one time. However, with the continuous miniaturization and the continuous increase of the storage capacity of memory systems, the frequency of occurrences of bit errors increases.

For example, for the NAND flash memory that can store a large amount of data at a relatively low silicon cost, Multi-Level Cell (MLC) technology can double the bit storage capacity per cell in the NAND Flash memory, while reducing the total die size. However, as compared with the standard Binary-Level Cell (BLC) technology, the reliability of the NAND flash memory that adopts the MLC technology is comparatively lower, and its performance is much lower than that of the NAND flash memory that adopts the BLC technology.

Figure 1:
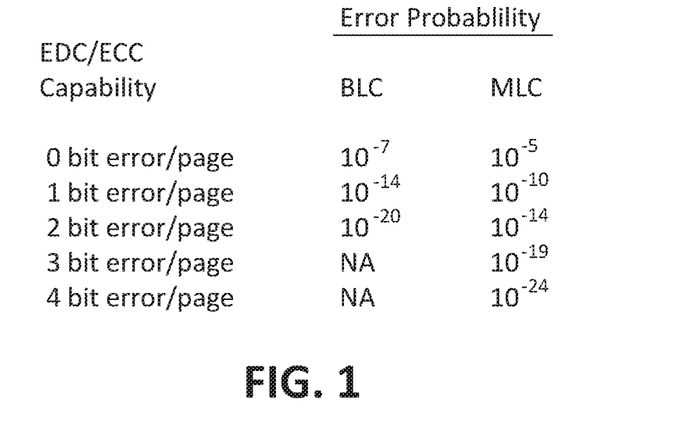
FIG. 1 is a diagram showing the comparison of error probability between the BLC-flash memory and the MLC-flash memory.

FIG. 1 shows the reported comparison of error probability between the BLC-flash memory and the MLC-flash memory. The stated EDC/ECC capability denotes the error detection/correction capability, and NA denotes that the report data is not available for the current condition. As shown in FIG. 1, as compared with the BLC-flash memory, the MLC-flash memory exhibits an increase in the error probability, namely the frequency of occurrences of errors.

In order to cope with the increase of the error frequency, an effective multi-bit error correction method is needed to improve the efficiency of error correction. The so-called multi-bit error correction allows error correction processing to correct multiple bits of the processed data at one time. At present, there are technologies that adopt Bose/Ray-Chaudhuri (BCH) codes to implement multi-bit error correction. That is, data are encoded and decoded by using BCH codes, and in the decoding process, the redundancy bits added in the BCH encoding process are utilized to perform error correction. BCH codes have a considerably high capability of error correction and a capability of correcting multiple errors. Developers can construct the generation polynomial of BCH codes according to the required error correction capability, and further, utilize the constructed generation polynomial to construct the corresponding BCH codes.

However, the existing multi-bit error correction technologies that adopt BCH codes are all implemented based on short BCH codes. That is, the error correction capabilities implemented by these technologies are only limited to relatively short BCH codes generated by utilizing simple generation polynomials. As compared with relatively long BCH codes, the error correction manner based on relatively short BCH codes has a relatively low code density (the proportion of the number of bits occupied by valid data bits to the number of the bits of the whole BCH code), because the proportion of the redundancy bits introduced in the case of the error correction manner based on relatively short BCH codes is necessarily greater than that in the case of the error correction manner based on relatively long BCH codes.

Consider the following example. In the case of 32-bit relatively short BCH codes, it is assumed that each 32-bit BCH code contains 8 bits of redundancy introduced thereinto; however, if long BCH codes such as 1000-bit BCH codes are adopted, it is possible to cause each 1000-bit BCH code to contain 8 bits of redundancy introduced thereinto as well. Accordingly, in the case where long BCH codes are adopted, the proportion taken up by valid data bits will increase remarkably and a relatively high code density can be obtained, whereby the effective utilization of memory space can be achieved.

However, since as compared with relatively short BCH codes, the complexity of decoding of relatively long BCH codes increases sharply, at present, there exist no technologies that implement multi-bit error correction based on relatively long BCH codes.

A brief introduction of BCH codes will first be given before the preferred embodiments of the present invention are described in detail. The introduction is given by taking a t-bit error correction BCH code (n, m, t) whose length is $n=2^m 1$ as an example, wherein, t is the number of bits that can be corrected at one time in an error correction processing.

BCH Code

The t-bit error correction BCH code (n, m, t) can be determined by a generation polynomial g(x) through the following three steps:

1) Firstly, find a primitive polynomial p(x), the degree of which is m and which is related to the generation polynomial g(x). The Galois field GF ($2^m$) is constructed over the primitive polynomial p(x).

2) Secondly, find the primitive elements in the Galois field GF ($2^m$), herein the primitive elements are generally defined as. Let $F_i(x)$ be the minimal polynomial of $^i$. Find $F_1(x)$, $F_3(x)$, ..., $F_{2t 1}(x)$.

3) Thirdly, g(x) is the least common multiple (LCM) of $F_1(x)$, $F_3(x)$, ..., $F_{2t 1}(x)$, which is written as:

$$g(x)=LCM[F_1(x), F_3(x), \ldots, F_{2t}(x)] \quad (1)$$

By using the generation polynomial g(x), the encoding procedure of the BCH code can be expressed as:

$$C(x)=I(x)g(x)=(i_0+i_1 x+ +i_k x^k)g(x)=c_0+c_1 x+ +c_{n 1}x^{n 1} \quad (2)$$

Where I(x) is the information polynomial associated with the information code to be encoded, and its length is k, and c(x) indicates the obtained BCH code. The generation polynomial g(x) is generated from the product of the primitive elements over the Galois field. Generally, a primitive element corresponds to a prime number. For example, $F_1(x)=x^2+1$ (the prime number 5), $F_3(x)=x^2+x+1$ (the prime number 7), and $g(x)=F_1(x) \cdot F_3(x)=x^4+x^3+x+1$.

For example, if BCH encoding is to be performed on the information code (1,1,0,0,1,1,0), the information polynomial of the information code is written as:

$$I(x)=x+x^2+x^5+x^6 \quad (3)$$

By setting $n=2^4-1$, thereby utilizing the equation (2) to encode the above information code, the BCH code (1,1,0, 0,1,1,0,0,0,0,0,1,0,0,1) will be obtained. It can be appreciated that the last 8 bits of the obtained BCH code are redundancy bits added in the BCH encoding process, and by utilizing these redundancy bits, errors can be detected and corrected. In addition, after error correction, a polynomial corresponding to the generation polynomial g(x) may be utilized to decode the corrected BCH code, so as to obtain the correct information code therein. Based on the above contents, certain existing theories about the BCH code that are to be applied in the present invention will be described below.

Certain Theories Exist about the BCH Code

It is assumed that E(x) is the error pattern and C(x) is the original BCH code, then the BCH code that is obtained before decoding and contains errors can be described as:

$$R(x)=C(x)+E(x)=r_0+r_1 x+ \ldots +r_{n 1}x^{n 1} \quad (4)$$

With respect to the BCH code R(x), the syndrome values corresponding thereto may be calculated in accordance with the following equation:

$$S_i(\ )=\text{Mod } [R(x)/p(x)]|_{x= i}=s_{i,0}+s_{i,1} + \ldots +s_{i,m 1}^m$$
$$1,i=1, 3, \ldots, 2t1 \quad (5)$$

Where Mod denotes modulo operation, and as mentioned above, p(x) is the primitive polynomial which is related to the generation polynomial g(x), and is the primitive element. The syndrome values can be calculated by the syndrome value generator disclosed in the article "The Theory of Information and Coding: Second Edition" published in the "Publishing House of Electronics Industry" in 2004, the relevant portions therein incorporated hereby by reference.

In addition, on the basis of the syndrome values, the position of an error in the obtained BCH code R(x) may be determined. More specifically, with reference to the article "Step-by-step Decoding of the Bose-Chaudhuri-Hocquenghem Codes" published in "On Information Theory" (vol. IT-11, no. 4, pp. 580-585) of the IEEE Trans in October 1965, the article "A high-speed real-time binary BCH decoder" published in "On Circuits and System for Video Technology" (vol. 3, no. 2, pp. 138-147) of the IEEE Trans in 1993 and the article "Information Theory, Coding and Cryptography" published in "China Machine Press" in 2005, there exist two important relations between the position of an error and a syndrome values. Herein, they are expressed as the following theorem 1 and theorem 2, respectively.

Theorem 1:

For any integer j 0, define $S_i^j(x)=\text{Mod } \{[x^j R(x^j)]/p(x)\}$, i=1, 3, ..., 2t-1 as the syndrome values calculated for the code which is obtained through each bit of the BCH code R(x) is shifted rightward by j bits while filling the bits vacated due to the rightward shifting in R(x) with 0. And for j 0, $S_i^{j+1}(x)=\text{Mod } \{[xS_i^j(x)]/p(x)\}$.

Theorem 2:

For a BCH code (n, m, t), define the syndrome value matrix $L_p^j$, p=1, 2, . . . , t as follows:

$$L_p^j = \begin{matrix} S_1^j & 1 & 0 & 0 \\ S_3^j & S_2^j & S_1^j & 0 \\ 6 & S_{2p1}^j & S_{2p2}^j & S_{2p3}^j & S_p^j \end{matrix} \quad (6)$$

Wherein, p denotes the number of errors. The so-called number of errors is in the unit of bit, and denotes the number of bits in which errors occur. According to a function $\det(L_p^j)$ for deriving the value of the determinant of the above syndrome value matrix $L_p^j$, the error eigenvector V corresponding to the case where each bit of R(x) is shifted rightward by j bits while filling the bits vacated due to the rightward shifting in R(x) with 0 can be determined.

Based on the above contents, the inventors of the present invention proposed a new multi-bit error correction theory based on a BCH code. A detailed description will be given as follows.

Multi-bit Error Correction Theory Based on a BCH Code

For ease of reference, in the present invention, $\det(L_p^j)$ is generalized with respect to the cases where the number p of errors is equal to 1, 2, 3, 4 as follows:

TABLE 1

| p | $\det(L_p^j)$ |
|---|---|
| 1 | $S_1^j$ |
| 2 | $S_1^{j3} + S_3^j$ |
| 3 | $S_1^{j6} + S_1^{j3}S_3^j + S_1^jS_5^j + S_3^{j2}$ |
| 4 | $S_1^{j10} + S_1^{j7}S_3^j + S_1^{j5}S_5^j + S_1^{j3}S_7^j + S_1^{j2}S_3^jS_5^j + S_1^jS_3^{j3} + S_3^jS_7^j + S_5^{j2}$ | wherein, $S_i^j$ are the syndrome values corresponding to the case where each bit of R(x) is shifted rightward by j bits while filling the bits vacated due to the rightward shifting in R(x) with 0. On the basis of the contents of the above Table 1, the error eigenvector $v^j$ corresponding to the case where each bit of R(x) is shifted rightward by j bits while filling the bits vacated due to the rightward shifting in R(x) with 0 is defined as follows:

$$V^j = (v_1^j, v_2^j, \ldots, v_t^j), v_p^j = \begin{cases} 1 & \text{if } \det(L_p^j) = 0 \\ 0 & \text{if } \det(L_p^j) \neq 0 \end{cases} \quad (7)$$

$$p = 1, 2, \ldots, t$$

On the basis of the error eigenvector $V^j$ in the above equation (7), the number of errors corresponding to the case where each bit of R(x) is shifted rightward by j bits while filling the bits vacated due to the rightward shifting in R(x) with 0 can be easily determined. The basic decision rule is as follows:

$$\text{if } N_{error} = 0, V^j = Q_0, Q_0 = (\underbrace{1, 1, \ldots, 1}_{t \text{ bits}}) \quad (8)$$

$$\text{if } N_{error} = 1, V^j = Q_1, Q_1 = (0, \underbrace{1, \ldots, 1}_{(t,1) \text{ bits}})$$

-continued $$\text{if } N_{error} = k, V^j = Q_k, Q_k = (\underbrace{0, 0, \ldots, 0}_{k \text{ bits}}, \underbrace{1, \ldots, 1}_{(tk) \text{ bits}})$$

$$\text{if } N_{error} = t, V^j = Q_t, Q_t = (\underbrace{0, 0, \ldots, 0}_{t \text{ bits}})$$

Wherein $N_{error}$ denotes the number of errors determined according to the above decision rule. In the present invention, modified syndrome values $\overline{S_i^j(x)}$ are defined. More specifically, it is assumed that in the BCH code R(x) on which error correction is to be performed, an error occurs in the position of the $j^{th}$ bit and the error pattern thereof is expressed as $x^1$, then the modified syndrome values $\overline{S_i^j(x)}$ are:

$$\overline{S_i^j(x)} = \text{Mod } [(R(x)+x^j)/p(x)]|_{x=\alpha^i} = \text{Mod } [R(x)/p(x)]|_{x=\alpha^i} + \text{Mod } [x^j/p(x)]|_{x=\alpha^i} = S_i^j(x) + M_i^j \quad (9)$$

Wherein $$M_i^j = \text{Mod } [x^j/p(x)]|_{x=\alpha^i} \quad (10)$$

Further wherein $M_i^j$ are called as modification factors (MF), $S_i^j$ are the syndrome values corresponding to the case where each bit of R(x) is shifted rightward by j bits while filling the bits vacated due to the rightward shifting in R(x) with 0, and as mentioned earlier, p(x) is the primitive polynomial which is related to the generation polynomial g(x).

Accordingly, as to the case where each bit of the obtained BCH code R(x) is shifted rightward j times while filling the bits vacated due to the rightward shifting in R(x) with 0, by calculating the corresponding syndrome values $S_i^j$, the error eigenvector $V^1$ which is based on the syndrome values, as well as the modified syndrome values $\overline{S_i^j(x)}$, and further, the error eigenvector $V^1$ which is based on the modified syndrome values, it can be determined whether the number $N_{error}$ error of errors changes in the case of the error eigenvectors $V^j$ and $\overline{V^j}$, to thereby determine whether the $j^{th}$ bit (equivalent to the current rightmost bit in the BCH code R(x) after each bit is shifted rightward by j bits) in R(x) is the bit in which an error occurs. Further, by correcting the bit in which an error occurs, multi-bit error correction based on a BCH code can be implemented. This is where the features of the present invention lie.

On the basis of the multi-bit error correction theory based on a BCH code according to the present invention, a detailed description of the preferred embodiments of the present invention will be given with reference to the drawings. It should be noted that in the following various preferred embodiments, the description is given by taking the t-bit error correction BCH code as an example.

Figure 2:
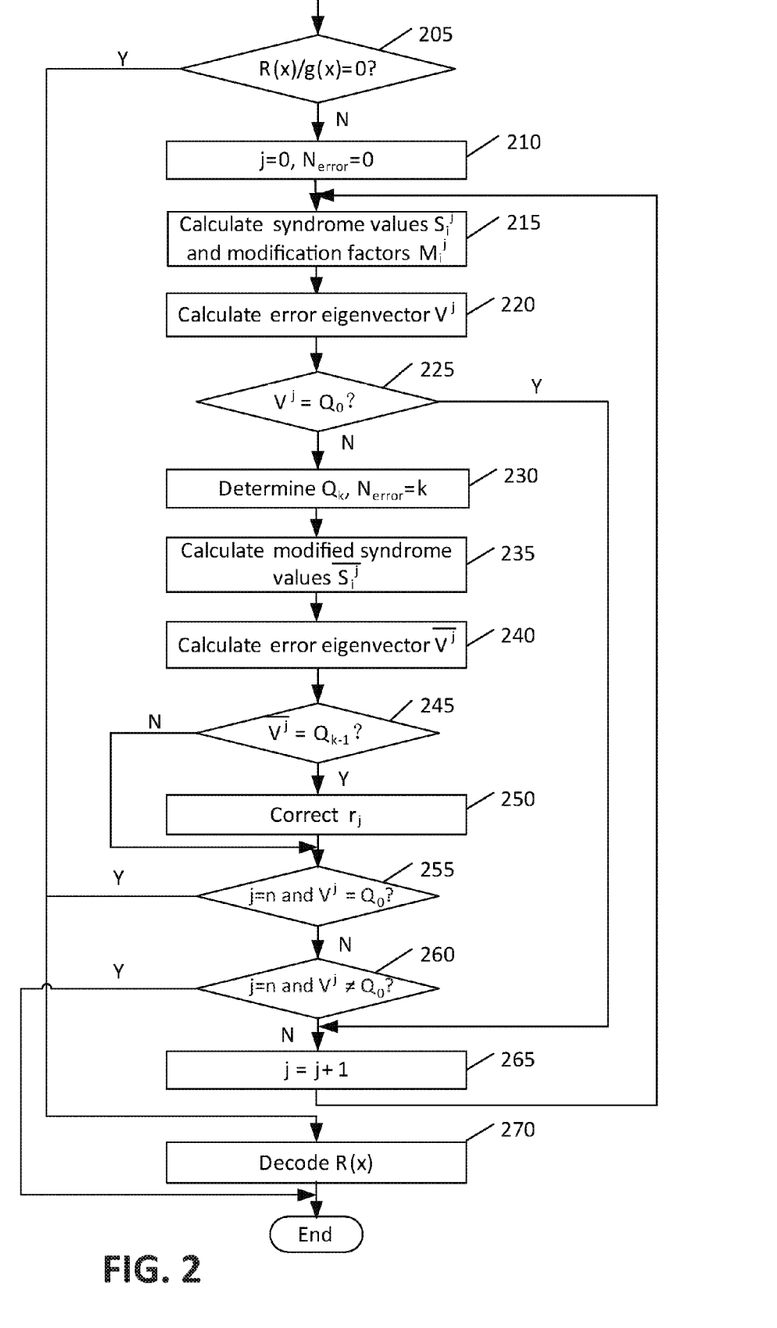
FIG. 2 is a flowchart of the multi-bit error correction method based on a BCH code according to an embodiment of the present invention.

FIG. 2 is a flowchart of the multi-bit error correction method based on a BCH code according to an embodiment of the present invention. As shown in FIG. 2, the multi-bit error correction method based on a BCH code of the present embodiment, first at step 205, divides the received BCH code R(x) that is to be decoded by the generation polynomial g(x), namely R(x)/g(x), so as to determine whether the BCH code R(x) can be divided exactly by the generation polynomial g(x). And if it can be divided exactly by the generation polynomial g(x), the process goes to step 270; otherwise, an error correction process of the following steps 210-265 is performed.

That is, for cyclic codes such as the BCH codes, any code word C(x) should be able to be divided exactly by the generation polynomial g(x) corresponding thereto. Therefore, at the receiving side, the division may be performed on the received code word R(x) by the generation polynomial g(x) corresponding to R(x). If no error occurs during the transmission, the received code word R(x) is the same as the sent code word c(x), and accordingly, the received code word R(x) can necessarily be divided exactly by the generation polynomial g(x) corresponding thereto; if an error occurs during the transmission, when the received code word R(x) is divided by the generation polynomial g(x) corresponding thereto, indivisibility and hence a remainder is possible. Therefore, it can be determined whether the received BCH code R(x) contains an error according to whether the remainder is zero.

At step 210, set j=0, $N_{error}$=0, wherein j denotes the number of rightward shift by each bit of the BCH code R(x), and $N_{error}$ denotes the number of errors. At step 215, for the BCH code R(x), in accordance with the above equations (5) and (10), the syndrome values $S_i^j$ and the modification factors $M_i^j$, i=1, 3, . . . , 2t–1, are calculated, wherein t is the number of bits that can be corrected at one time in an error correction processing.

At step 220, in accordance with Table 1 and the above equation (6), the error eigenvector $V^j$ that is based on the syndrome values $S_i^j$ is calculated. At step 225, it is determined whether the error eigenvector $V^1$=$Q_0$, wherein, according to the above equation (7), $$Q_0 = \underbrace{(1, 1, \ldots , 1)}_{t\ bits}.$$

At this step, if the error eigenvector $V^j$=$Q_0$, it is indicated that the BCH code R(x) no longer contains errors, and accordingly, the process turns to step 265; otherwise, the process proceeds to step 230.

At step 230, in accordance with the above equation (7), $Q_k$ is determined based on the error eigenvector $V^j$, and the number $N_{error}$ of errors is set as $N_{error}$=k. At step 235, in accordance with the above equation (9), the modified syndrome values $\overline{S_i^j(x)}$ are erive based on the syndrome values $S_i^j$ and the modification factors $M_i^j$. At step 240, the modified syndrome values $\overline{S_i^j(x)}$ are used to substitute for the syndrome values $S_i^j$ to calculate the error eigenvector $\overline{V^j}$ that is based on the modified syndrome values $\overline{S_i^j(x)}$.

At step 245, it is determined whether the error eigenvector $\overline{V^j}$=$Q_{k\ 1}$, i.e. it is determined whether the number $\overline{N_{error}}$ of errors corresponding to the error eigenvector $\overline{V^j}$ is smaller than the number $N_{error}$ of errors corresponding to the error eigenvector $V^1$ by 1. If so, it should be determined that the $j^{th}$ bit in the BCH code R(x) is one in which an error occurs, and therefore the process proceeds to step 250; otherwise, the process turns to step 255.

That is, in the present embodiment, for the $j^{th}$ bit in R(x), firstly, the corresponding error eigenvector $V^j$ is calculated in the case where the value of this bit keeps unchanged, and further, the number $N_{error}$ of errors currently existing in R(x) is determined based on the error eigenvector $V^j$; then, it is assumed that the $j^{th}$ bit contains an error, whereby the modified syndrome values $\overline{S_i^j(x)}$ corresponding to the case of changing the $j^{th}$ bit to the inverse value (i.e. 1 changed to 0, 0 changed to 1) are derived, and the error eigenvector $\overline{V^j}$ that is based on the modified syndrome values $\overline{S_i^j(x)}$ is calculated, and further, the number $\overline{N_{error}}$ of errors currently existing in R(x) is determined based on the error eigenvector $\overline{V^j}$; finally, by comparing the numbers $N_{error}$ and $\overline{N_{error}}$ of errors obtained from the two calculations to check whether they are equal, it is determined whether the $j^{th}$ bit is the bit in which an error occurs.

At step 250, the value $r_j$ of the $j^{th}$ bit (equivalent to the current rightmost bit obtained after shifting each code position of the BCH code R(x) rightward by j bits, and after the rightward shifting, filling the deficient bits with 0) in the BCH code R(x) is corrected, i.e. a NOT operation is performed on $r_j$. For example, if $r_j$ is 0, after the NOT operation, $r_j$ changes to 1.

At step 255, it is determined whether j=n and $V^j$=$Q_0$, wherein n is the code length of the BCH code R(x). If so, the error correction is completed, the corrected BCH code R(x) is obtained, and accordingly, the process turns to step 270; otherwise, the process proceeds to step 260. At step 260, it is determined whether j=n and $V_j$ $Q_0$. If so, the error correction fails, and the process ends; otherwise, the process proceeds to step 265. That is, if j=n and $V^j$ $Q_0$, it is indicated that the number of errors exceeds t, and accordingly, the method cannot obtain the correct information code in the BCH code R(x).

At step 265, set j=j+1, and the process returns to step 215, so as to perform processing corresponding to the next shifting of the BCH code R(x). At step 270, a polynomial corresponding to the generation polynomial g(x) is utilized to decode the corrected BCH code R(x), so as to obtain the information code therein. And the process ends.

The above is a detailed description of the multi-bit error correction method based on a BCH code according to the present embodiment. In the present embodiment, for each bit in the obtained BCH code, firstly, in the case where the value of this bit keeps unchanged, the error eigenvector is calculated, to thereby determine the number of errors in the BCH cod. It is then assumed that the bit contains an error, and accordingly, in the case where the value of this bit is changed to the inverse value, the current error eigenvector is calculated to thereby determine the number of errors. Finally, by comparing the numbers of errors obtained from the two calculations to check whether they are equal, it is determined whether the bit is the bit that contains an error; and further, in the case where the bit contains an error, by correcting the bit that contains an error, multi-bit error correction based on a BCH code is implemented. It may be appreciated that in the present embodiment, since such an error correction manner is adopted, even for relatively long BCH codes, error correction can be easily performed, thereby implementing multi-bit error correction based on relatively long BCH codes while increasing the code density and improving the efficiency of error correction. Multi-bit error correction based on relatively short BCH codes may also be implemented by using the same method, as one of ordinary skill in the art will appreciate.

Figure 3:
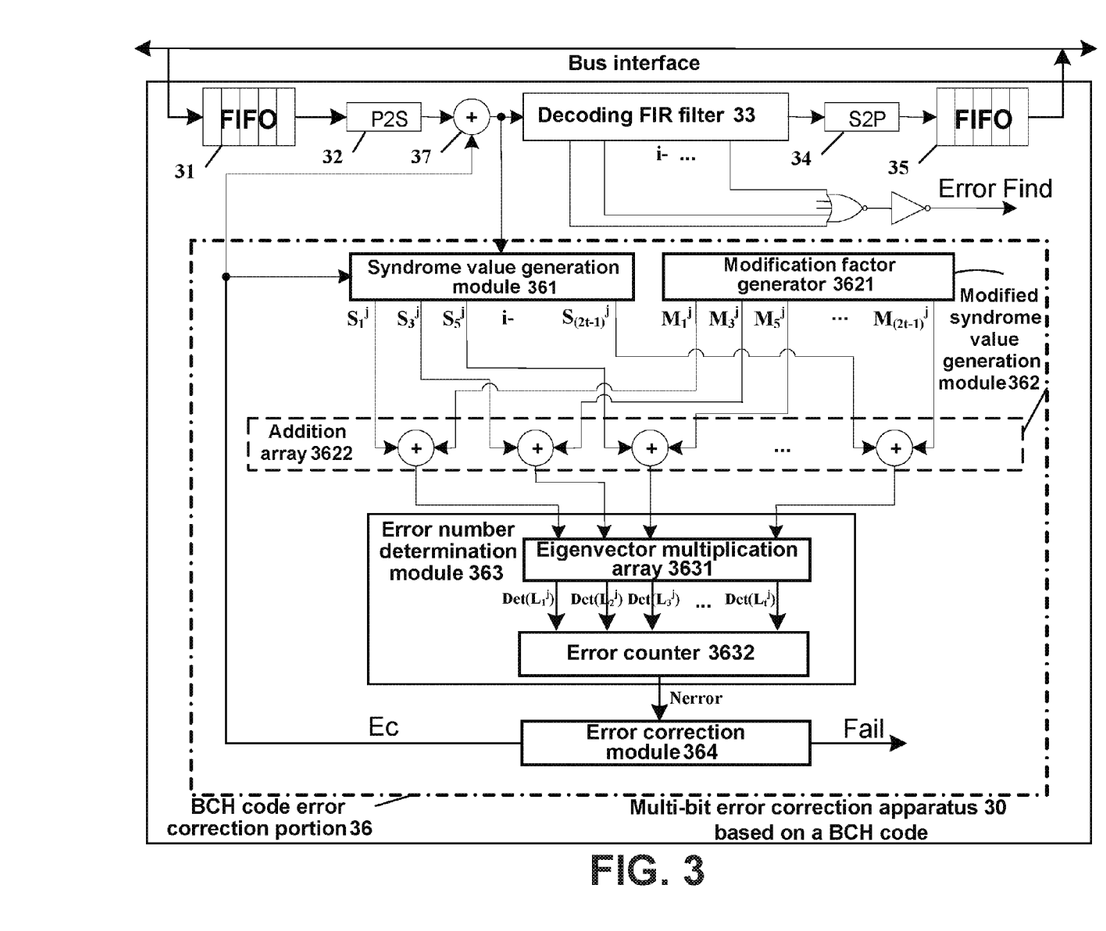
FIG. 3 is a circuit block diagram of the multi-bit error correction apparatus based on a BCH code according to an embodiment of the present invention.

Under the same inventive concept, the present invention provides a multi-bit error correction apparatus based on a BCH code. Next, a description will be given with reference to the drawings. FIG. 3 is a circuit block diagram of the multi-bit error correction apparatus based on a BCH code according to an embodiment of the present invention. More specifically, as shown in FIG. 3, the multi-bit error correction apparatus 30 based on a BCH code of the present embodiment comprises a FIFO (First In First Out) buffer 31, a parallel-to-serial (P2S) conversion module 32, a decoding FIR filter 33, a serial-to-parallel (S2P) conversion module 34, a FIFO buffer 35, a BCH code error correction portion 36 and an adder 37.

More specifically, the FIFO buffer 31 is used for receiving from the outside and storing a BCH code to be decoded. The parallel-to-serial conversion module 32 obtains in order from the FIFO buffer 31 the BCH code R(x) to be decoded, and performs parallel-to-serial conversion thereon. The decoding FIR filter 33 divides the BCH code R(x) on which parallel-to-serial conversion has been performed by the parallel-to-serial conversion module 32 by the generation polynomial g(x), so as to determine whether R(x) can be divided exactly by the generation polynomial g(x). If it is determined that the BCH code R(x) can be divided exactly by the generation polynomial g(x), the decoding FIR filter 33 decodes the BCH code R(x) based on the generation polynomial g(x), so as to obtain the information code therein. On the other hand, if it is determined that R(x) cannot be divided exactly by the generation polynomial g(x), the decoding FIR filter 33 sends out an "Error Find" signal, to indicate that an error has been found in the BCH code R(x). One of ordinary skill in the art will appreciate that the decoding FIR filter 33 can be implemented, based on the prior art, by utilizing an FIR filter. More specifically, the FIR filter can be implemented by using the conventional shift registers and XOR gates.

Next, the serial-to-parallel conversion module 34 performs serial-to-parallel conversion on the information code obtained after the decoding by the decoding FIR filter 33, and outputs the information code on which serial-to-parallel conversion has been performed to the FIFO buffer 35. The FIFO buffer 35 caches the information code that is received from the serial-to-parallel conversion module 34 and is ready to be transmitted to the outside. In addition, the BCH code error correction portion 36 is activated when the decoding FIR filter 33 sends out the "Error Find" signal, and is used for performing multi-bit error correction on the BCH code R(x) in which an error has been found by the decoding FIR filter 33.

More specifically, as shown in FIG. 3, the BCH code error correction portion 36 further comprises a syndrome value generation module 361, a modified syndrome value generation module 362, an error number determination module 363 and an error correction module 364. The syndrome value generation module 361 shifts each bit of the BCH code R(x) on which error correction is to be performed rightward by 1 bit while filling vacated bit in the BCH code with 0, and calculates syndrome values corresponding to the shifting of the BCH code R(x).

According to one implementation manner of the present invention, the syndrome value generation module 361 may be implemented by DSP programming, wherein the syndrome value generation module 361, corresponding to each shifting of the BCH code R(x) on which error correction is to be performed, calculates syndrome values $S_1^j$, $S_3^j$, $S_5^j$, ..., $S_{(2t-1)}^j$ corresponding to the shifting in accordance with the above equation (5), wherein, t is the number of bits that can be corrected at one time in a multi-bit error correction processing, and j denotes the current number of shifting of the BCH code R(x).

According to another implementation manner of the present invention, the syndrome value generation module 361 may be implemented, according to the syndrome value generator disclosed by the article "The Theory of Information and Coding: Second Edition" published in the "Publishing House of Electronics Industry" in 2004, the relevant portions therein hereby incorporated by reference, by utilizing an FIR filter. More specifically, the FIR filter may be implemented by using the conventional shift registers and XOR gates.

The modified syndrome value generation module 362, corresponding to each rightward one bit shifting of the BCH code R(x) on which error correction is to be performed, calculates modified syndrome values corresponding to the shifting of the BCH code R(x), wherein the modified syndrome values are those corresponding to the case that the current rightmost bit of the BCH code R(x) under the shifting is changed to the inverse value. According to one implementation manner of the present invention, the modified syndrome value generation module 362 may be implemented by DSP programming.

According to another implementation manner of the present invention, the modified syndrome value generation module 362 further comprises a modification factor generator 3621 and an addition array 3622, as shown in FIG. 3. The modification factor generator 3621, corresponding to each rightward one bit shifting of the BCH code R(x), according to instructions, and in accordance with the above equation (10), generates modification factors $M_1^j$, $M_3^j$, $M_5^j$, ..., $M_{(2t-1)}^j$ which are used for modifying the syndrome values $S_1^j$, $S_3^j$, $S_5^j$, ..., $S_{(2t-1)}^j$ generated by the syndrome value generation module 361. The modification factor generator 3621 may be implemented by utilizing an FIR filter. More specifically, the FIR filter may be implemented by using the conventional shift registers and XOR gates.

In the case where the modification factor generator 3621 is instructed to generate modification factors, the addition array 3622 adds the syndrome values $S_1^j$, $S_3^j$, $S_5^j$, ..., $S_{(2t-1)}^j$ generated by the syndrome value generation module 361 and the modification factors $M_1^j$, $M_3^j$, $M_5$, ..., $M_{(2t-1)}$ generated by the modification factor generator 3621 together respectively in accordance with the above equation (9), to thereby obtaining modified syndrome values. The modified syndrome values are those corresponding to the case that the current rightmost bit of the BCH code R(x) under the shifting is changed to the inverse values. In addition, these modified syndrome values are input into the error number determination module 363. On the other hand, in the case where the modification factor generator 3621 is not instructed to generate modification factors, the syndrome values $S_1^j$, $S_3^j$, $S_5^j$, ..., $S_{(2t-1)}^j$ generated by the syndrome value generation module 361 are not modified by modification factors, but are input into the error number determination module 363 directly via the addition array 3622.

The error number determination module 363, corresponding to each rightward one bit shifting of the BCH code R(x), determines a first error number in the BCH code under the shifting based on the syndrome values calculated by the syndrome value generation module 361, and determines a second error number in the BCH code under the shifting based on the modified syndrome values calculated by the modified syndrome value generation module 362. According to one implementation manner of the present invention, the error number determination module 363 may be implemented by DSP programming. According to another implementation manner of the present invention, the error number determination module 363 further comprises an eigenvector multiplication array 3631 and an error counter 3632, as shown in FIG. 3.

Corresponding to each rightward one bit shifting of the BCH code R(x), in the case where the modification factor generator 3621 is not instructed to generate modification factors, based on the syndrome values $S_1^j$, $S_3^j$, $S_5^j$, ..., $S_{(2t-1)}^j$ directly transmitted from the syndrome value generation module 361 via the addition array 3622, and in accordance with the above Table 1, the eigenvector multiplication array 3631 performs in parallel the calculation of the syndrome value matrices Det(L1), Det(L2), Det(L3), ..., Det(Lt) that is based on the syndrome values, and in accordance with the above equation (7), the values of these syndrome matrices Det(L1), Det(L2), Det(L3), ..., Det(Lt) form the error eigenvector V, namely V={Det(L1), Det(L2), Det(L3), ..., Det(Lt)}. In addition, based on the error eigenvector V, and in accordance with the above equation (8), the error counter 3632 determines the first error number under the shifting, that is based on the syndrome values $S_1^j, S_3^j, S_5^j, \ldots, S_{(2t-1)}^j$.

On the other hand, in the case where the modification factor generator 3621 is instructed to generate modification factors, based on the modified syndrome values transmitted from the addition array 3622, and in accordance with the above Table 1, the eigenvector multiplication array 3631 implements in parallel the calculation of the syndrome matrices Det(L1), Det(L2), Det(L3), ..., Det(Lt) that is based on the modified syndrome values, and in accordance with the above equation (7), the values of these syndrome matrices Det(L1), Det(L2), Det(L3), ..., Det(Lt) form the error eigenvector V, namely V={Det(L1), Det(L2), Det(L3), ..., Det(Lt)}. In addition, based on the error eigenvector V, and in accordance with the above equation (8), the error counter 3632 determines the second error number under the shifting that is based on the modified syndrome values.

Figure 4:
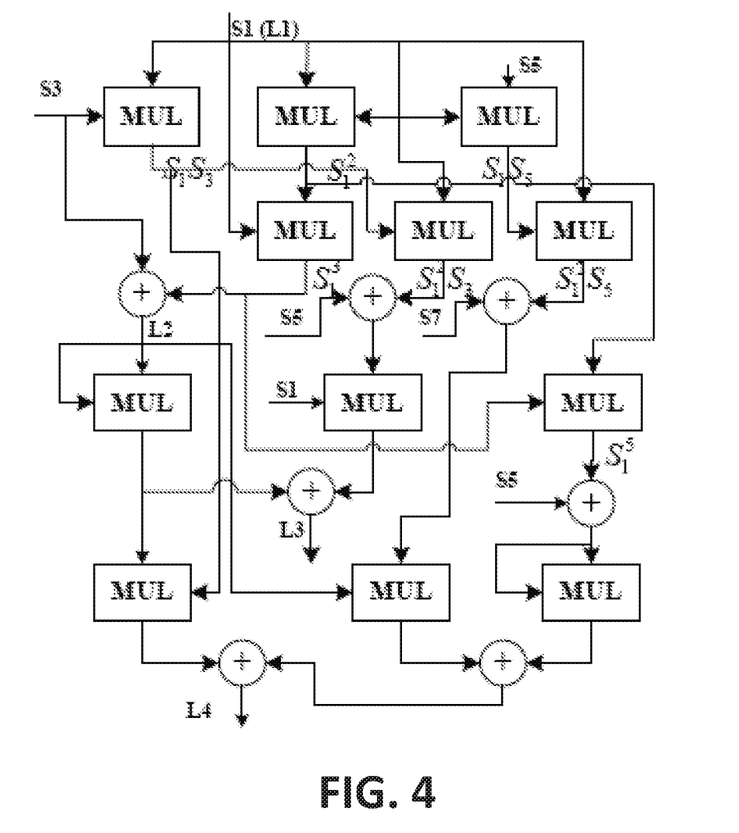
FIG. 4 is a circuit block diagram of a multiplication array, in the case where t=4, in the apparatus as shown in FIG. 3.

FIG. 4 shows the concrete implementation of the eigenvector multiplication array 3631 in the case where t=4.

Returning to FIG. 3, corresponding to each rightward one bit shifting of the BCH code R(x), the error correction module 364 determines whether the current rightmost bit of the BCH code R(x) under the shifting contains an error according to whether the second error number is smaller than the first error number by 1. On the case where it is determined that the current rightmost bit contains an error, the error correction module 364 instructs to correct the current rightmost bit, so as to change it to the inverse value.

Next, by taking one implementation manner as an example, the working process of the BCH code error correction portion 36 is described in a schematic manner. The working process mainly comprises the following phases (1), (2). Phase (1): in the case where the modified syndrome value generation module 362 does not work, i.e. the modification factor generator 3621 therein is not instructed to generate modification factors, the error number EN in the BCH code R(x) is determined. The concrete process of this phase is as follows. First, set Len=n, wherein n denotes the code length of the BCH code R(x), while Len denotes the position of the current bit of the BCH code R(x).

Next, the syndrome value generation module 361 generates syndrome values $S_1^j, S_3^j, S_5^j, \ldots, S_{(2t-1)}^j$ corresponding to the case where the BCH code R(x) is shifted rightward by j=n-Len bits (not shifted in phase (1)), and these syndrome values are directly input into the error number determination module 363 via the addition array 3622 in the modified syndrome value generation module 362.

The multiplication array 3631 in the error number determination module 363 calculates the values of the syndrome matrices $Det(L_1^j), Det(L_2^j), Det(L_3^j), \ldots, Det(L_t^j)$ based on the syndrome values $S_1^j, S_3^j, S_5^j, \ldots, S_{(2t-1)}^j$ and the values of these syndrome matrices $Det(L_1^j), Det(L_2^j), Det(L_3^j), \ldots, Det(L_t^j)$ form the error eigenvector V, which is transmitted to the error counter 3632.

Based on the error eigenvector V, and in accordance with the above equation (8), the error counter 3632 determines the number $N_{error}$ of errors (the first error number), and transmits it to the error correction module 364. In the error correction module 364, if it is determined that the number $N_{error}$ of errors excesses t, a "Fail" signal is output, to indicate that error correction has failed. If the number $N_{error}$ of errors does not excess t, it is recorded that the error number EN=$N_{error}$.

Phase (2): in the case where the modified syndrome value generation module 362 works, i.e. the modification factor generator 3621 therein is instructed to generate modification factors, error detection and error correction are performed on each bit in the BCH code R(x). The concrete process of this phase is as follows. First, the syndrome value generation module 361 generates syndrome values $S_1^j, S_3^j, S_5^j, \ldots, S_{(2t-1)}^j$ corresponding to the case where the BCH code R(x) is shifted rightward by j=n-Len bits. Next, the modification factor generator 3621 in the modified syndrome value generation module 362 generates modification factors $M_1^j, M_3^j, M_5^j, \ldots, M_{(2t-1)}^j$ corresponding to the case where the BCH code R(x) is shifted rightward by j=n-Len bits.

Furthermore, the syndrome values $S_1^j, S_3^j, S_5^j, \ldots, S_{(2t-1)}^j$ generated by the syndrome value generation module 361 and the modification factors $M_1^j, M_3^j, M_5^j, \ldots, M_{(2t-1)}^j$ generated by the modification factor generator 3621 are added together at the addition array 3622, respectively, to thereby obtain modified syndrome values. These modified syndrome values are input into the error number determination module 363.

The multiplication array 3631 in the error number determination module 363 calculates the values of the syndrome matrices $Det(L_1^j), Det(L_2^j), Det(L_3^j), \ldots, Det(L_t^j)$ based on the modified syndrome values, and the values of these syndrome matrices $Det(L_1^j), Det(L_2^j), Det(L_3^j), \ldots, Det(L_t^j)$ form the error eigenvector V, which is transmitted to the error counter 3632.

Based on the error eigenvector V, and in accordance with the above equation (8), the error counter 3632 determines the number $N_{error}$ of errors (the second error number), and transmits it to the error correction module 364. In the error correction module 364, if it is determined that the number $N_{error}$ the of errors (second error number) is smaller than the error number EN (the first error number) recorded in the error correction module 364 by 1, it is indicated that an error exists in the current $j^{th}$ bit in the BCH code R(x) (equivalent to the current rightmost bit obtained after the BCH code R(x) is shifted rightward j times). Accordingly, via the adder 37, the error correction module 364 corrects the $i^{th}$ bit in R(x) as 0→1 or 1→0.

On the other hand, in the error correction module 364, set EN=EN-1, Len=Len-1, and send out an Ec signal, to indicate that the error in the $j^{th}$ bit has been found and corrected. At this time, after the error correction module 364 send out the Ec signal, the syndrome value generation module 361 regenerates syndrome values $S_1^j, S_3^j, S_5^j, \ldots, S_{(2t-1)}^j$ corresponding to the case where the BCH code R(x) is shifted rightward by j bits, and the modification factor generator 3621 in the modified syndrome value generation module 362 regenerates corresponding modification factors $M_1^j, M_3^j, M_5^j, \ldots, M_{(2t-1)}^j$.

It should be noted that the process in which the syndrome value generation module 361 regenerates the syndrome values $S_1^j, S_3^j, S_5^j, \ldots, S_{(2t-1)}^j$ may be implemented by shifting, in the syndrome value generation module 361, the syndrome values generated for the previous rightward one bit shifting, and filling the vacated bits at the left end with 0. The process in which the modification factor generator 3621 regenerates the corresponding modification factors $M_1^j, M_3^j, M_5^j, \ldots, M_{(2t-1)}^j$ may be implemented by shifting, in the modification factor generator 3621, the modification factors generated for the previous rightward one bit shifting, and filling the vacated bits at the left end with 1.

Next, the syndrome values $S_1^j, S_3^j, S_5^j, \ldots, S_{(2t-1)}^j$ regenerated by the syndrome value generation module 361 and the modification factors $M_1^j, M_3^j, M_5^j, \ldots, M_{(2t-1)}^j$ regenerated by the modification factor generator 3621 are added together at the addition array 3622, respectively, to thereby obtain modified syndrome values corresponding to the current shift j=n-Len.

The eigenvector multiplication array 3632 in the error number determination module 363 calculates the values of the corresponding syndrome matrices $Det(L_1^j), Det(L_2^j), Det(L_3^j), \ldots, Det(L_t^j)$ based on the modified syndrome values, to form the error eigenvector V. The error counter 3632 determines the number $N_{error}$ of errors (the second error number) based on the error eigenvector V, and transmits it to the error correction module 364. In the error correction module 364, it is determined whether the number $N_{error}$ of errors is smaller than the recorded error number EN (the first error number) by 1, so as to determine whether an error exists in the current $j^{th}$ bit of the BCH code R(x). In the case where $N_{error}$ is smaller than EN by 1, i.e. an error exists, the $j^{th}$ bit is corrected. It will be appreciated that for each subsequent bit in the BCH code R(x), the above phase (2) will be performed repeatedly until the error number EN is equal to 0.

The above is a detailed description of the multi-bit error correction apparatus based on a BCH code of the present embodiment. Herein, the apparatus 30 and the components thereof can be implemented with specifically designed circuits or chips or be implemented by a computer (processor) executing corresponding programs.

Figure 5:
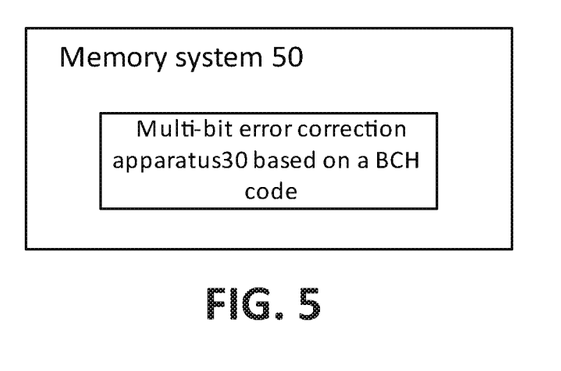
FIG. 5 is a block diagram of the memory system according to an embodiment of the present invention.

In an additional embodiment, the present invention also provides a memory system. FIG. 5 is a block diagram of the memory system according to an embodiment of the present invention. As shown in FIG. 5, the memory system 50 of the present embodiment comprises the abovementioned multi-bit error correction apparatus 30 based on a BCH code.

In addition, it should be noted that the multi-bit error correction method and apparatus based on a BCH code of the present invention may be applied not only to memory systems, but also to any filed that needs to perform multi-bit error correction based on a BCH code.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While one or more embodiments of the present invention have been illustrated in detail, the skilled artisan will appreciate that modifications and adaptations to those embodiments may be made without departing from the scope of the present invention as set forth in the following claims.

What is claimed is:

1. A processor apparatus for performing multi-bit error correction based on a BCH code in a computing environment, comprising:
   a syndrome value generation module adapted for shifting each bit of the BCH code on which error correction is to be performed rightward by 1 bit while filling a bit vacated due to the rightward shifting in the BCH code with 0, and calculating syndrome values corresponding to the shifting of the BCH code;
   a modified syndrome value generation module in communication with the syndrome value generation module, wherein the modified syndrome value generation module is adapted for, corresponding to each rightward one bit shifting of the BCH code on which error correction is to be performed, calculating modified syndrome values corresponding to the shifting of the BCH code, wherein the modified syndrome values are those corresponding to a case that the current rightmost bit of the BCH code under the shifting is changed to an inverse value; and
   an error number determination module in communication with the modified syndrome value generation module, wherein the error number determination module is adapted for, corresponding to each rightward one bit shifting of the BCH code on which error correction is to be performed, determining a first error number in the BCH code under the shifting based on the syndrome values calculated by the syndrome value generation module; wherein, commensurate with the input of the syndrome value generation module, the modified syndrome value generation module, and the error number determination module, the error correction is performed on the BCH code thereby implementing the multi-bit error correction on the BCH code while increasing a code density and decreasing a redundancy of the BCH code to increase a proportion of valid data bits within the BCH code such that effective utilization of memory space of the computing environment is increased.

2. The processor apparatus of claim 1, wherein the error number determination module is further adapted for determining a second error number in the BCH code under the shifting based on the modified syndrome values calculated by the modified syndrome value generation module; and
   wherein the modified syndrome value generation module further comprises: an error correction module in communication with the error number determination module, wherein the error correction module is adapted for, corresponding to each rightward one bit shifting of the BCH code on which error correction is to be performed, determining whether the current rightmost bit of the BCH code under the shifting contains an error according to whether the second error number is smaller than the first error number by 1.

3. The processor apparatus of claim 1, wherein the modified syndrome value generation module further comprises:
   a modification factor generator adapted for, corresponding to each rightward one bit shifting of the BCH code on which error correction is to be performed, generating in accordance with the following equation modification factors for modifying the syndrome values calculated by the syndrome value generation module:

$$M_i^j = \text{Mod}\,[x^j/p(x)]|_{x=\alpha^i}$$

wherein, $M_i^j$ are the equation modification factors, j denotes a current number of shifting of the BCH code, and p(x) is a primitive polynomial which is related to the generation polynomial of the BCH code, and an addition array in communication with the modification factor generator, wherein the addition array is adapted for, corresponding to each rightward one bit shifting of the BCH code on which error correction is to be performed, adding in accordance with the following equation the syndrome values calculated by the syndrome value generation module and the modification factor generated by the modification factor generator together, to generate modified syndrome values:

$$\overline{S_i^j(x)} = \text{Mod}\,[(R(x)+x^j)/p(x)]|_{x=\alpha^i} = \text{Mod}\,[R(x)/p(x)]|_{x=\alpha^i} + \text{Mod}\,[x^j/p(x)]|_{x=\alpha^i} = S_i^j(x) + M_i^j$$

wherein $\overline{S_i^j(x)}$ denotes the modified syndrome values, and denotes the syndrome value calculated by the syndrome value generation module.

4. The processor apparatus as recited in claim 3, wherein the error number determination module further comprises:

an eigenvector multiplication array adapted for, corresponding to each rightward one bit shifting of the BCH code on which error correction is to be performed, calculating an error eigenvector in accordance with the following Table and the following equation, and based on the input from the addition array:

| p | $\det(L_p^j)$ |
|---|---|
| 1 | $S_1^j$ |
| 2 | $S_1^{j3} + S_3^j$ |
| 3 | $S_1^{j6} + S_1^{j3}S_3^j + S_1^jS_5^j + S_3^{j2}$ |
| 4 | $S_1^{j10} + S_1^{j7}S_3^j + S_1^{j5}S_5^j + S_1^{j3}S_7^j + S_1^{j2}S_3^jS_5^j + S_1^jS_7^{j3} + S_3^jS_7^j + S_5^{j2}$ |

$$V^j = (v_1^j, v_2^j, \ldots, v_t^j),\ v_p^j = \begin{cases} 0 & \text{if } \det(L_p^j) = 0 \\ 0 & \text{if } \det(L_p^j) \neq 0 \end{cases},$$

$$p = 1, 2, \ldots, t$$

wherein $L_p^j$ denotes a syndrome matrix corresponding to the shifting of the BCH code, $\det(L_p^j)$ is a function for deriving the value of the determinant of the syndrome matrix $L_p^j$, $V^j$ denotes the error eigenvector, and t denotes a number of error corrections during one error correction processing, and an error counter in communication with the eigenvector multiplication array, wherein the error counter is adapted for, corresponding to each rightward one bit shifting of the BCH code on which error correction is to be performed, determining the error number based on the error eigenvector:

if $N_{error} = 0$, $V^j = Q_0$, $Q_0 = (\underbrace{1, 1, \ldots, 1}_{t\text{-bits}})$ if $N_{error} = 1$, $V^j = Q_1$, $Q_1 = (0, \underbrace{1, \ldots, 1}_{(t-1)\text{-bits}})$ if $N_{error} = k$, $V^j = Q_k$, $Q_k = (\underbrace{0, 0, \ldots, 0}_{k\text{-bits}}, \underbrace{1, \ldots, 1}_{(t-k)\text{-bits}})$ if $N_{error} = t$, $V^j = Q_t$, $Q_t = (\underbrace{0, 0, \ldots, 0}_{t\text{-bits}})$ wherein $N_{error}$ denotes the error number.

5. The processor apparatus of claim 4, wherein, in the case where each bit of the BCH code has not yet been shifted rightward:

the modification factor generator is not activated, the syndrome values calculated by the syndrome value generation module are directly transmitted to the eigenvector multiplication array via the addition array, the eigenvector multiplication array calculates an error eigenvector based on the syndrome values, and the error counter determines an error number in the BCH code as the first error number based on the error eigenvector.

6. The processor apparatus of claim 5, wherein, in the case where the number of rightward shifting by each bit of the BCH code is not 0:

the modification factor generator is activated to generate the modification factors for modifying the syndrome values calculated by the syndrome value generation module corresponding to the shifting of the BCH code, the addition array adds the syndrome values calculated by the syndrome value generation module and the modification factors generated by the modification factor generator together, so as to generate the modified syndrome values, the eigenvector multiplication array calculates an error eigenvector based on the modified syndrome values, and the error counter determines an error number as the second error number based on the error eigenvector.

7. The processor apparatus of claim 6, wherein the error correction module is further adapted for, corresponding to each shifting of the BCH code, determining whether the second error number is smaller than the first error number by 1, wherein if the second error number is smaller than the first error number by 1, the error correction module is further adapted for:

determining that an error exists in the current rightmost bit of the BCH code under the shifting, and performing an instruction to correct the current rightmost bit, so as to change the current rightmost bit to an inverse value.

8. The processor apparatus of claim 7, wherein if the number of rightward shifting by each bit of the BCH code is not 0:

the syndrome value generation module is further adapted for generating syndrome values corresponding to the shifting by shifting the syndrome values calculated corresponding to the previous rightward one bit shifting of the BCH code while filling the bit at the left end with 0, and the modification factor generator is further adapted for generating modification factors corresponding to the shifting by shifting the modification factors generated corresponding to the previous rightward one bit shifting of the BCH while filling the bit at the left end with 1.

9. The processor apparatus of claim 8, wherein the syndrome value generation module and the modification factor generator are both implemented by utilizing shift registers and XOR gates.

10. The processor apparatus of claim 9, wherein the processor apparatus is integrated into a memory system.

* * * * *